(12) United States Patent
Rajsuman et al.

(10) Patent No.: US 7,178,115 B2
(45) Date of Patent: Feb. 13, 2007

(54) MANUFACTURING METHOD AND APPARATUS TO AVOID PROTOTYPE-HOLD IN ASIC/SOC MANUFACTURING

(75) Inventors: Rochit Rajsuman, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 384 days.

(21) Appl. No.: 10/412,143

(22) Filed: Apr. 11, 2003

(65) Prior Publication Data

US 2003/0217343 A1 Nov. 20, 2003

Related U.S. Application Data

(60) Provisional application No. 60/371,808, filed on Apr. 11, 2002.

(51) Int. Cl.
*G06F 17/50* (2006.01)
(52) U.S. Cl. .............................................. 716/4; 716/5
(58) Field of Classification Search ................ 716/4–6, 716/3, 17, 18; 703/14–16; 702/125, 126; 714/741
See application file for complete search history.

(56) References Cited

U.S. PATENT DOCUMENTS

| | | | | |
|---|---|---|---|---|
| 6,061,283 | A | | 5/2000 | Takahashi et al. |
| 6,269,467 | B1 | | 7/2001 | Chang et al. |
| 6,304,837 | B1 | * | 10/2001 | Geiger et al. .................. 703/14 |
| 6,360,343 | B1 | * | 3/2002 | Turnquist ................... 714/731 |
| 6,557,133 | B1 | * | 4/2003 | Gomes ........................ 714/738 |
| 6,609,229 | B1 | * | 8/2003 | Ly et al. ......................... 716/4 |
| 6,634,008 | B1 | * | 10/2003 | Dole .............................. 716/1 |
| 6,651,275 | B1 | * | 11/2003 | Rummell ...................... 5/99.1 |
| 6,678,643 | B1 | * | 1/2004 | Turnquist et al. ............. 703/14 |
| 6,754,763 | B2 | * | 6/2004 | Lin ............................. 710/317 |
| 6,910,166 | B2 | * | 6/2005 | Suzuki et al. ............... 714/741 |
| 6,922,650 | B2 | * | 7/2005 | Sato ........................... 702/120 |
| 6,925,617 | B2 | * | 8/2005 | Bayraktaroglu et al. ....... 716/4 |

(Continued)

OTHER PUBLICATIONS

Debashis Bhattacharya "Hierarchical test access architecture for embedded cores in an integrated circuit" 1998, IEEE.

(Continued)

*Primary Examiner*—Paul Dinh
*Assistant Examiner*—Nghia M. Doan
(74) *Attorney, Agent, or Firm*—Muramatsu & Associates

(57) ABSTRACT

A manufacturing process for LSIs uses an event tester simulator and an event tester to avoid prototype hold. In the LSI manufacturing method an LSI is designed under an EDA (electronic design automation) environment to produce design data of a designed LSI, and logic simulation is performed on a device model of the LSI design in the EDA environment with use of a testbench and producing a test vector file of an event format as a result of the logic simulation. Then, simulation data files are verified with use of the design data and the testbench by operating an event tester simulator, and a prototype LSI is produced through a fabrication provider by using the design data. The prototype LSI is tested by an event tester by using the test vector file and the simulation data files and test results is feedbacked to the EDA environment or the fabrication provider.

18 Claims, 12 Drawing Sheets

U.S. PATENT DOCUMENTS

| | | | |
|---|---|---|---|
| 7,089,135 B2* | 8/2006 | Rajsuman et al. | 702/117 |
| 2003/0079189 A1* | 4/2003 | Abadir et al. | 716/4 |
| 2003/0131324 A1* | 7/2003 | Takenaka | 716/3 |
| 2003/0217341 A1* | 11/2003 | Rajsuman et al. | 716/4 |

OTHER PUBLICATIONS

George Swan "Crosscheck—A practical solution for ASIC testability" 1989 International Test Conference.

R. Rajsuman "On fault location in combinational logic circuits" 1991, IEEE.

* cited by examiner

US 7,178,115 B2

MANUFACTURING METHOD AND APPARATUS TO AVOID PROTOTYPE-HOLD IN ASIC/SOC MANUFACTURING

This application claims the benefit of U.S. Provisional Application Ser. No. 60/371,808 filed Apr. 11, 2002.

FIELD OF THE INVENTION

This invention relates to a manufacturing method and apparatus for large scale integrated circuits (LSI), and more particularly, to a manufacturing method for LSIs using an event based IC test system in which test data is utilized in an event form which enables a direct use of design simulation data produced in an electronic design automation (EDA) environment, thereby avoiding prototype-hold in the LSI manufacturing.

BACKGROUND OF THE INVENTION

This application describes a modified industrial process for LSI manufacturing. One of the major issues today in manufacturing LSI such as ASIC (application specific integrated circuit) or SOC (system-on-a-chip) is a standstill of a production process in the prototype test. More than 50% ICs coming out of the prototype fabrication stage fail to pass the test, which results in suspension of the production process to the next stage (ex. application development and mass production). Within the context of this application, such a situation is called prototype-hold or proto-hold.

When the first silicon (prototype LSI) comes out of fabrication, in majority of cases, it shows some failures in the prototype evaluation. The cause of these failures varies; it can be an error in vector translation (test data conversion), or an error in a test program or even fabrication defects. In a large number of cases, the cause of failure is not easily identifiable and hence, the silicon (prototype LSI) is put on prototype hold (proto-hold). Until the cause is identified and rectified, the silicon cannot be used for application development and subsequently it cannot go into volume production.

The primary factor behind this issue is that the design environment is different from the test-engineering environment and therefore, the cause of failure is not easily identified. When a chip is taped-out (design data of the chip is released from the design engineer), a test engineer is required to convert the design-simulation vectors for use in the test-engineering environment. The test-engineering environment is usually in a cyclized format according to tester time-sets and wave-groups. The test engineer further translates the vectors into another format such as STIL (Standard Test Interface Language) or WGL (Waveform Generation Language) unique to a particular test system and creates a test program that has almost no resemblance to the original simulation. Hence, when the first silicon (prototype LSI chip) shows a failure (failing vector in the test vectors), it is quite cumbersome to determine the cause of the failure.

The semiconductor industry involves extremely expensive and large scale production facilities and a production volume of each LSI device is large. Thus, such a delay caused by the proto-hold is extremely costly for application developers, the design house (ASIC house or design center) as well as for the silicon foundry (semiconductor manufacture). Therefore, there is an urgent need in the industry for a new semiconductor manufacturing process and test system that operate in the IC design environment and eliminate all the complexity involved in the test data conversion into cyclized form as it is done by the present day test systems.

SUMMARY OF THE INVENTION

It is, therefore, an object of the present invention to provide a new semiconductor production method incorporating a new type of semiconductor IC test system which is capable of avoiding the prototype-hold problems interrelating with the design environment and test engineering environment in a seamless fashion.

It is another object of the present invention to provide a new semiconductor production method incorporating a new semiconductor IC test system (event tester) which is capable of direct use of design simulation data produced in an electronic design automation (EDA) environment.

It is a further object of the present invention to provide a new semiconductor production method incorporating a new semiconductor IC test system (event tester) in a test-engineering environment and an event tester simulator in an EDA environment, thereby eliminating needs of creating test vectors and test programs in the test-engineering environment.

The present invention proposes a new manufacturing process incorporating an event based test system (event tester) for the LSI manufacturing in which there is no proto-hold. This method is comprised of the steps of: designing an LSI under an EDA (electronic design automation) environment to produce design data of a designed LSI, performing logic simulation on a device model of the LSI design in the EDA environment with use of a testbench and producing a test vector file of an event format as a result of the logic simulation, verifying simulation data files with use of the design data and the testbench by operating an event tester simulator, producing a prototype LSI through a fabrication provider by using the design data, and testing the prototype LSI by an event tester by using the test vector file and the simulation data files and feedbacking test results to the EDA environment or the fabrication provider.

According to the present invention, the method and architecture of the test system allows testing and debug of ICs without diverting from the environment in which the IC was designed. The traditional IC test systems require conversion of the design simulation data into a cyclized form, such as the WGL or STIL format. The new method and architecture avoids such conversion and uses the design simulation data "as is". Thus, the method and apparatus of the present invention allow testing in the environment identical to the design simulation environment, which avoids the proto-hold. The new semiconductor production process incorporates the event tester in the test-engineering environment and the event tester simulator in the EDA environment, thereby eliminating needs of creating the test vectors and test programs in the test-engineering environment, which saves engineering time and reduces overall cost involved in the LSI production.

DETAILED DESCRIPTION OF THE INVENTION

Figures 1A, 1B:
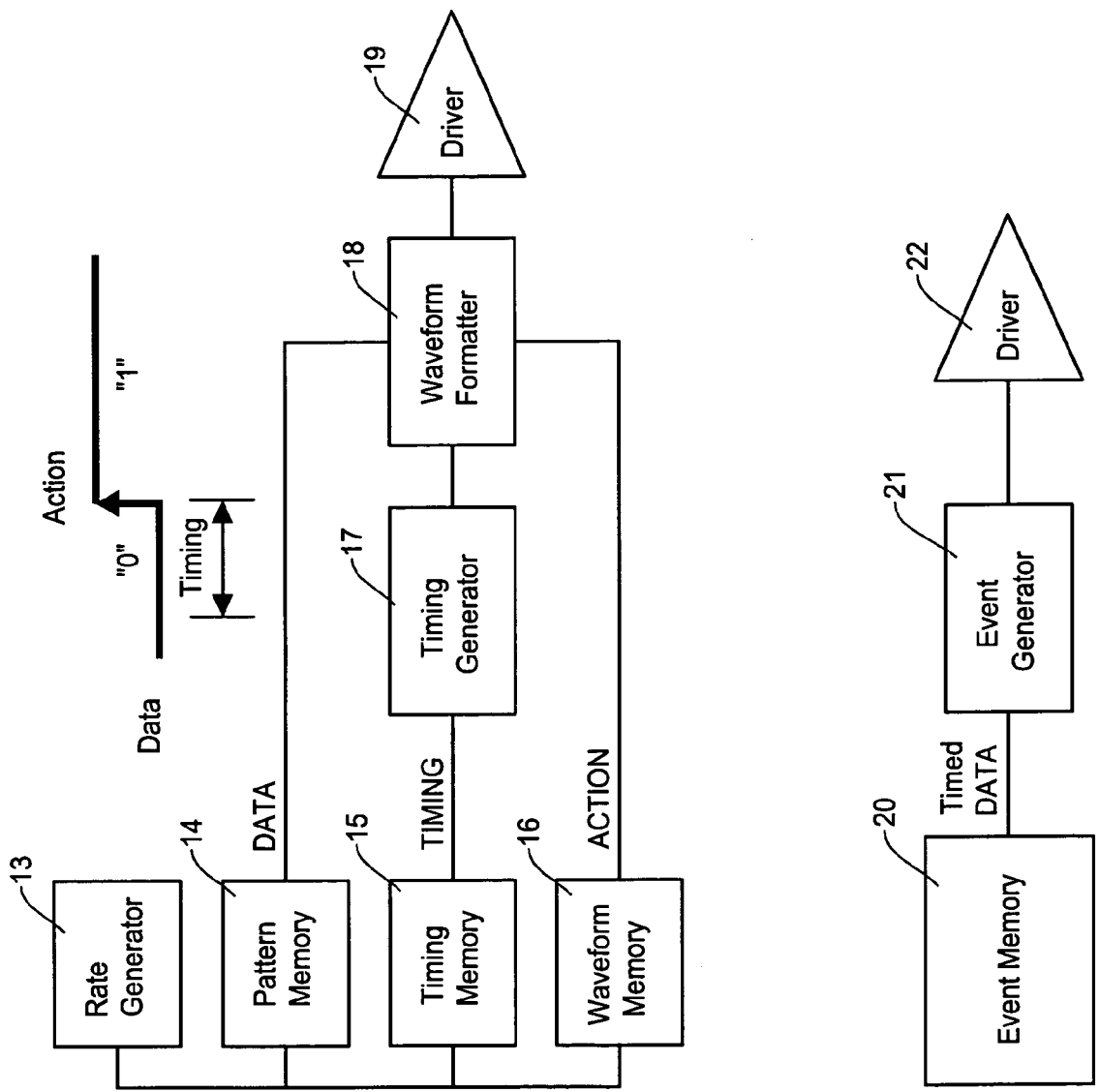
FIG. 1A a schematic diagram showing a conventional test system architecture.
FIG. 1B is a schematic diagram showing a new test system architecture for use in the production process of the present invention.

The present invention is now described in more detail with reference to the accompanying drawings. The present invention proposes a new LSI manufacturing process incorporating an event based test system (event tester) for the LSI manufacturing in which there is no proto-hold. This method is based upon a new technology, a new equipment and fundamental changes in the existing process. The concept and architecture of new equipment, semiconductor manufacturing process based upon it and specific data format used are described in this application.

In the production process of the present invention, rather than the conventional cycle based test system (cyclized tester), an event based test system (event tester) is used to test the prototype LSI chip such as an ASIC or SOC. In the design environment (design house), a design engineer creates various files for implementing the test on the chip by the event tester. Such files include test pattern data, test parameter data, tester channel data, etc., the correctness of which is verified through an event tester simulator before fabrication of the prototype based on the design and simulation data of the chip.

In the design stage under an EDA (electronic design automation) environment, the LSI design is simulated repeatedly until it meets the design specifications. During this process, the design engineer runs numerous simulation cycles with use of hardware description language such as Verilog or VHDL to create a set of test vectors. The design engineer inspects the results of these simulations using EDA tools like SignalScan, by Cadence, Calif. that allows them to view the waveforms and timing. Thus, the desirable method to check first silicon should be the original Verilog/VHDL vectors "as is" with no translation; and testing of LSI should occur in the design environment.

The difficulty in obtaining a solution that allows testing in the design environment is the present day tester architecture (cyclized tester), more specifically the time-sets and wavegroups that require vectors to be cyclized and re-formatted according to the tester. To use the design simulation data, the traditional IC test systems require conversion of design simulation data into cyclized form, such as WGL (Waveform Generation Language) or STIL (Standard Test Interface Language) format.

Thus, to obtain a desirable solution, a complete change in the environment and process as well as the tester architecture is required. The solution needs a fundamental change that simplifies the testing rather than adding yet more complexity to the already complicated process. The problem should be resolved by eliminating the vector translation process so that there is no possibility of proto-hold due to the test vectors.

The basic requirements to operate a tester in the design simulation environment are: (1) the tester architecture should support changes in the signal values identical to the events as observed in the design simulation such as in Verilog/VHDL, and (2) events on each tester pin should be treated independently similar to the logic simulation in the design environment rather than cyclizing them according to wave-groups and time-sets.

The inventors of this invention investigated this possibility and mechanism to support the design environment for test, and made fundamental changes in the tester architecture. FIG. 1A shows the conventional cyclized tester architecture, and FIG. 1B shows the event tester architecture for use in the production process of the present invention. In the conventional semiconductor test system, the test pattern or vectors (input stimulus, strobes, etc.) are created based on test data described in a cyclized form. As noted above, such a traditional test system is sometimes called a cycle based test system or a cyclized tester where various data for producing the input stimulus and strobes is defined relative to corresponding test cycles (tester rates or time-sets) and waveform segments.

As shown in FIG. 1A, the cyclized tester is configured by a rate generator 13 for producing tester rates (test cycles), a pattern memory 14 for storing pattern data, a timing memory 15 for storing timing data, a waveform memory 16 for storing waveform (action) data, a timing generator 17 for producing timing signals based on the timing data, a waveform formatter 18 for producing a test pattern based on the timing signals, pattern data and waveform data, and a driver 19 for applying the test vectors to a device under test (DUT).

As shown in FIG. 1B, the event based test system (event tester) is configured by an event memory 20 for storing event data (timed data), an event generator 21 for generating events based on the event data, and a driver 22 for applying the test vectors to the DUT. The more details of the architecture and concept of the event based test system has been introduced in U.S. Pat. Nos. 6,360,343 and 6,532,561 and U.S. application Ser. No. 10/150,777 filed May 20, 2002 owned by the same assignee of the present invention, all of which are incorporated by reference.

The rate generator 13, timing generator 17, pattern memory 14, waveform memory 16 and timing memory 15 of the cyclized tester are eliminated, and instead, the event memory 20 and event generator 21 are used in the event tester. The event memory 20 contains the events as observed in the Verilog/VHDL simulation. The event generator 21 converts these events into actions (to apply test vectors) by using the associated timing as recorded in the Verilog/VHDL simulation. Through the driver 22, these actions are applied to the DUT and response of the DUT is compared against the IC simulation values to detect a fault.

In the event tester, by eliminating the rate and timing generators, pattern memory, waveform memory and timing memory, the architecture effectively eliminates the need of cyclizing the vectors and translation into other formats such as WGL or STIL. The event memory 20 in FIG. 1B stores events as they were recorded in the IC simulation. Thus, each test vector (action) will be created by driving an event (data "0" or "1") with its timing. In the cyclized tester of FIG. 1A, each test vector will be created by driving a specified waveform (action) based on a pattern data ("0" or "1") at a timing specified by a time-set (test cycle). Thus, the event tester accomplishes the objective that cyclization and vector translation process should be eliminated from the testing; and that the test environment should be the same as the IC design environment.

Figure 2:
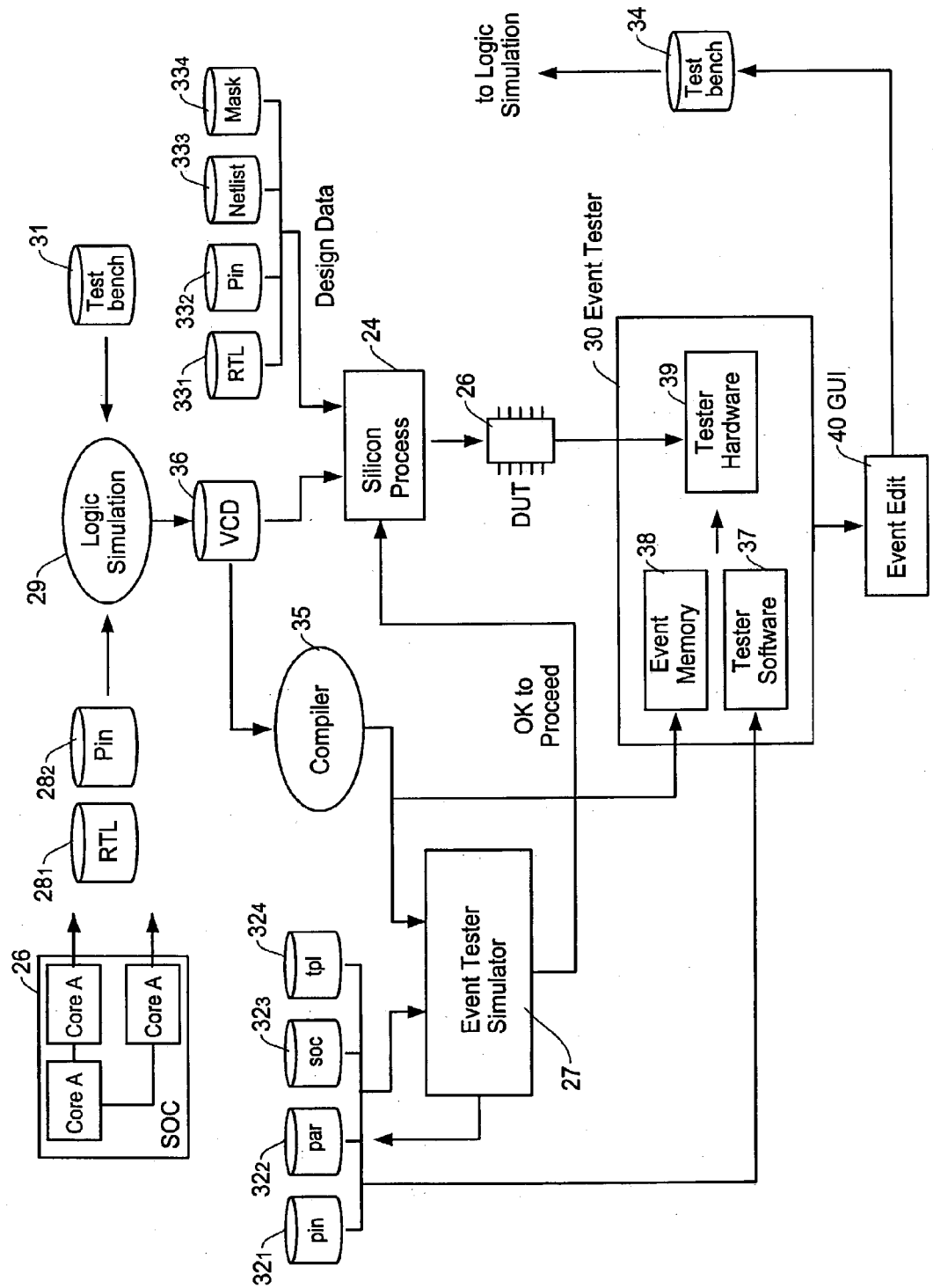
FIG. 2 is a diagram showing a concept of an overall LSI production process of the present invention using an event tester in the test-engineering environment and an event tester simulator in the design environment.

FIG. 2 is a diagram showing a concept of an overall LSI production process of the present invention using an event tester 30 in the test-engineering environment and an event tester simulator 27 in the design (EDA) environment. At the time of tapeout, the design data for the prototype fabrication created through the EDA environment is delivered to the silicon process. The test vectors for the event tester can be directly created from a VCD (value change dump) file created as a result of the logic simulation in the EDA environment. The test vectors and various test related data are verified by the event tester simulator 27 before the fabrication of the prototype silicon.

Since the production method of the present invention includes the event tester simulator similar to the present day EDA environment, all of the test related data including test vectors for use with the event tester are verified. Such data are unique to the particular LSI to be tested and event tester incorporated in the production process. In other words, the primary idea of the present invention is to check everything by the event tester simulator before the silicon fabrication. Thus, when an actual LSI is tested on the event tester, there are no data related error.

Accordingly, if the actual test shows a failure, it can only be either a timing error or physical defect in the manufacturing. If it is a manufacturing defect, the LSI can go to failure analysis to determine what type of physical defect has occurred. If it is a timing error, it can be debugged by the event tester with use of various functions of the event tester described below. More details of the this production process in FIG. 2 will be explained later after describing the problems involved in the conventional cycle based test system (cyclized tester) and advantages of the event based test system (event tester) with reference to FIGS. 3–6.

Figure 3:
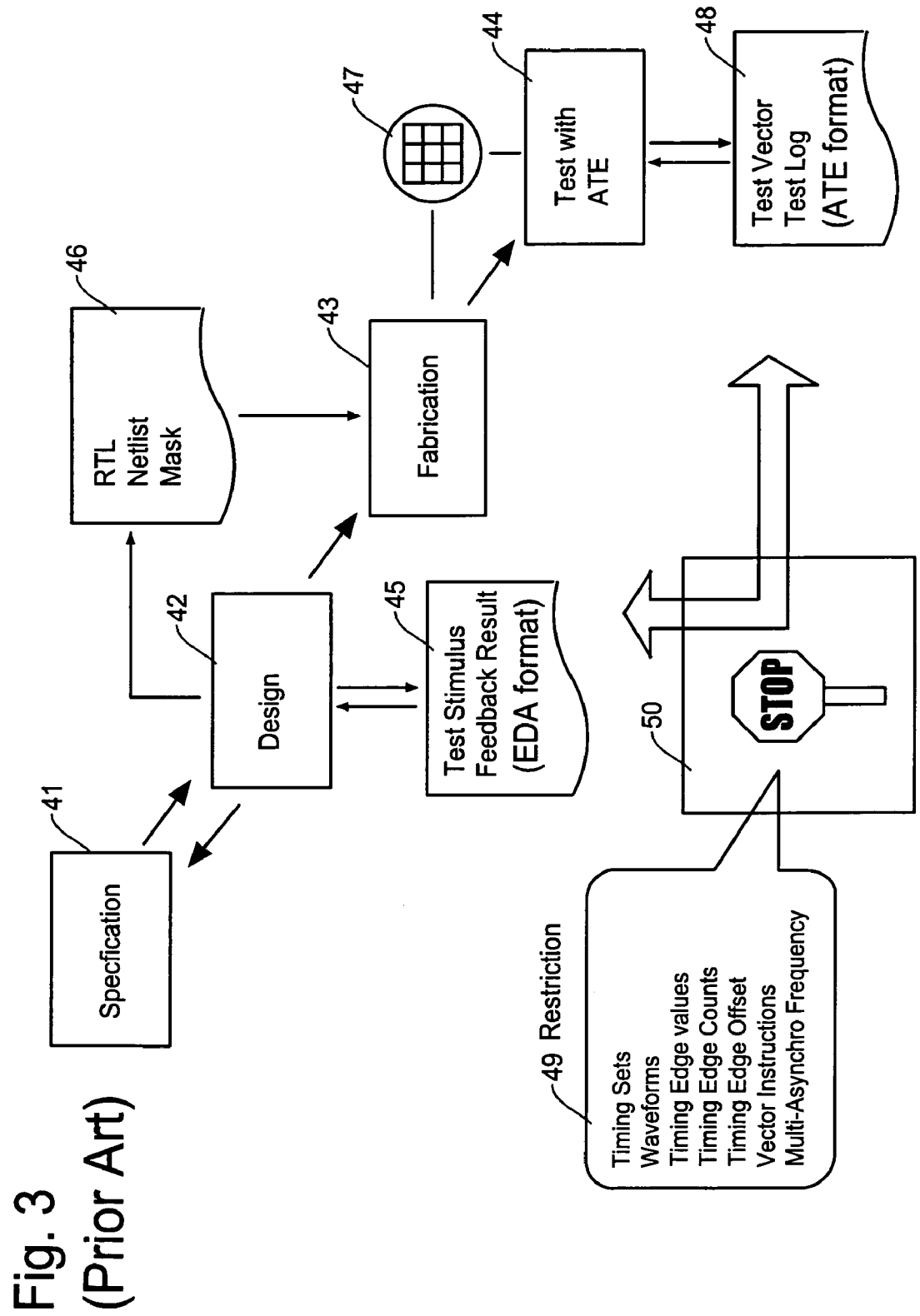
FIG. 3 is a diagram showing an LSI production process using a conventional test system where data formats between a design environment and a test are disjoint.

FIG. 3 shows an LSI production process using the conventional cycle based test system (cyclized tester) in which the data formats between the design environment and the test environment are disjoint. FIG. 3 illustrates that because the data format (ATE format) used in the cyclized tester and the data format resulted from the design stage (EDA format) are different from one another, the logic simulation data cannot be used without data conversion (vector translation). Further, the cyclized tester involves various restrictions, which makes it very difficult to correctly and sufficiently converts the logic simulation data to the test data for the cyclized tester or vice versa.

More specifically, in the example of FIG. 3, based on the specification 41 of an intended LSI, such as ASIC or SOC, the designer designs the LSI in a design phase 42. As noted above, the LSI design is simulated repeatedly until it meets the design specifications. As a result of this logic simulation process, test stimulus file (testbench) 45 is created which is, for example, a VCD (value change dump) file of Verilog. The testbench 45 is in the EDA format which is the event format noted above.

After the design phase 42, a design data file 46 is created which typically includes RTL (register transfer level) data, netlist data and mask data. Based on the data in the design data file 46, a prototype LSI 47 is created in a fabrication stage 43. In a test phase 44, the prototype LSI 47 is tested by ATE (automatic test equipment) which is typically a conventional cycle based test system (cyclized tester) noted above. For testing the prototype LSI 47 by the cyclized tester, a test data file 48 is created for generating test vectors.

As noted above, the test data used in the conventional test system is in the cyclized format (ATE format) which has no similarity with the EDA format. Thus, it is necessary to convert the testbench (EDA formatted data) to the ATE format acceptable to the cyclized tester. This requirement causes following problems in that (1) vector conversion consumes extensive time, server and disk capacities, and is very error-prone, (2) cyclization of vectors makes multiple clock domain devices untestable, and (3) due to a finite number of resources such as time-sets, waveform groups, timing generators, etc., in the cyclized tester, there arises tester limitations, examples of such restrictions are illustrated in a restriction box 49. Thus, it is impossible to completely convert the testbench to the ATE format. Because of such an incompatibility, one cannot test the prototype in a complete fashion, which causes a proto-hold problem illustrated by a stop box 50.

Figure 4:
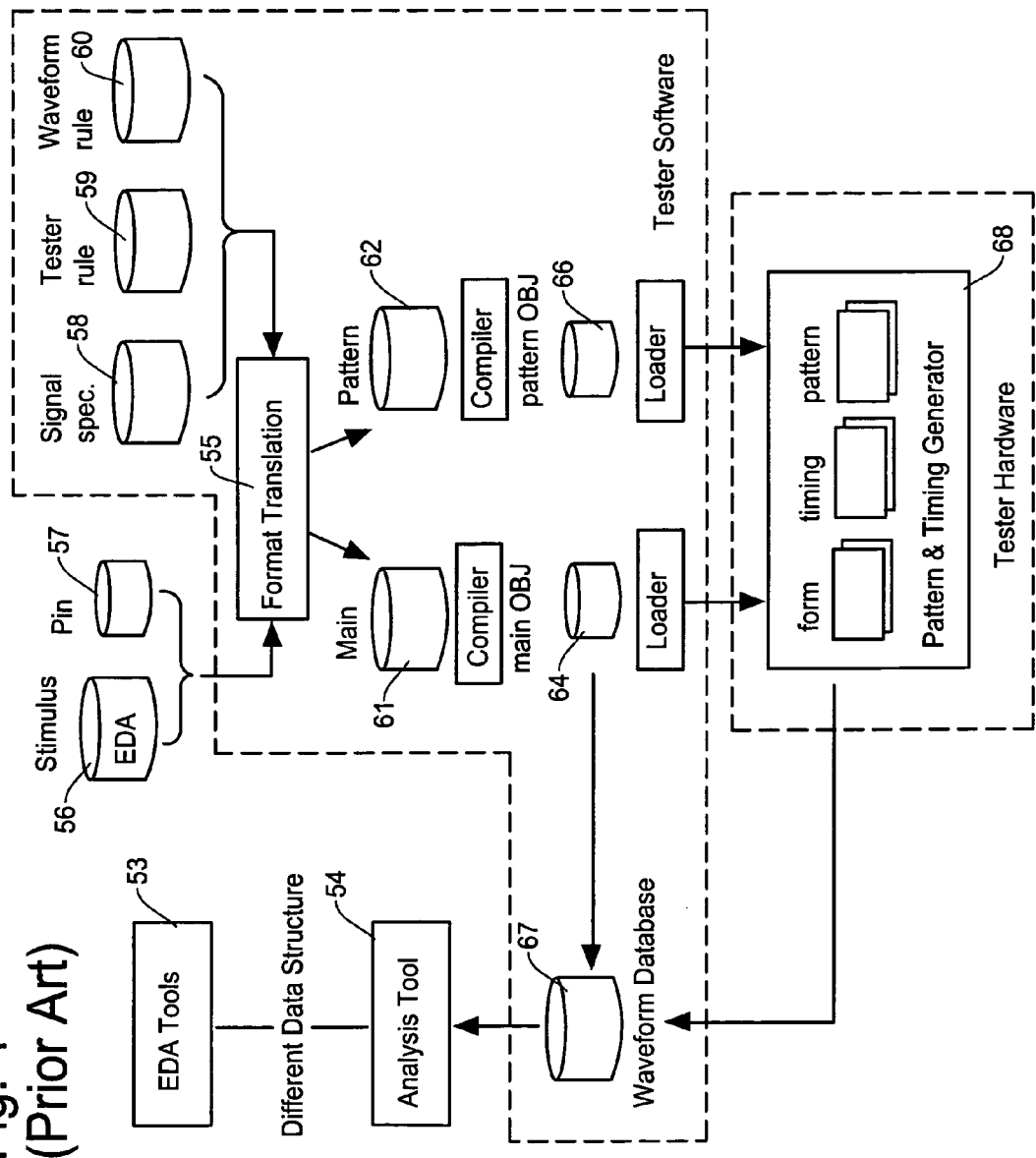
FIG. 4 is a diagram showing a data conversion process between the data structure from the design environment and the test data used in the conventional test system.

FIG. 4 shows a data conversion (vector translation) process between the data structure from the design environment and the data structure used in the test-engineering environment. As noted above, the stimulus data created in the EDA environment has to be converted to the cyclized format for producing the cycle based test pattern by the conventional test system. Thus, the process of FIG. 4 converts the test stimulus file 45 to the test vector file 48 of FIG. 3.

In the example of FIG. 4, the design validation data (testbench) of the LSI deigned under the EDA environment is stored in a stimulus data (VCD) file 56 and a pin data file 57. The data from the stimulus data file 56 concerning input output values and the data from the pin data file 57 concerning the pin arrangement of the LSI are given to a conversion software 55 whereby converted to the cycle based data. Further, data describing various specifications of the test system from data files 58, 59 and 60 concerning test parameters, tester pin arrangement, etc. are also given to the conversion software 55 and thus converted to the cycle based data.

Through this procedure, a main (test plan) file 61 and a test pattern file 62 are created. Here, the main file 61 includes the timing data which describes test pattern waveforms, test cycles, and timings of the waveforms. The pattern file 62 includes test vectors. The converted data noted above are further converted to object codes by respective compilers, thereby forming object code files 64 and 66. The data in the object code files 64 and 66 are transferred to corresponding memories (waveform, timing, and pattern memories) in the pattern and timing generator 68 in the tester hardware through loaders.

The data stored in the waveform, timing and pattern memories in the cyclized tester have a cycle based data structure as noted above. When testing the prototype LSI, the data is read from these memories, thereby producing a test pattern. The test pattern is applied to the LSI via pin electronics (not shown). The test result data is reorganized in a data file 67 such as failure data storage to show input and output waveforms. The data from the file 67 is used in the failure analysis by an analysis tool 54. The result of the failure analysis can be computed to the result of EDA tools 53 in the EDA environment, however, the failure analysis result cannot be directly used there because of the different data structure.

As described in the foregoing, because the data obtained from the EDA design environment and the data used in the semiconductor test system are different in the structure, various conversion processes must be used for the data conversion. Especially, various conversion software in a dotted line (tester software) are required for the data conversion in the cycle based test system. All of these software are unnecessary in the event tester of the present invention.

As noted above, the production method of the present invention is implemented by incorporating the event tester in the test environment and an event tester simulator in the EDA environment. As noted above, the concept of the event based test system has been introduced in U.S. Pat. Nos. 6,360,343 and 6,532,561 and U.S. application Ser. No. 10/150,777 owned by the same assignee of the present invention, both of which are incorporated by reference. Before explaining the LSI production method of the present invention, an event based test system will be briefly described with reference to FIGS. 5 and 6.

Figure 5:
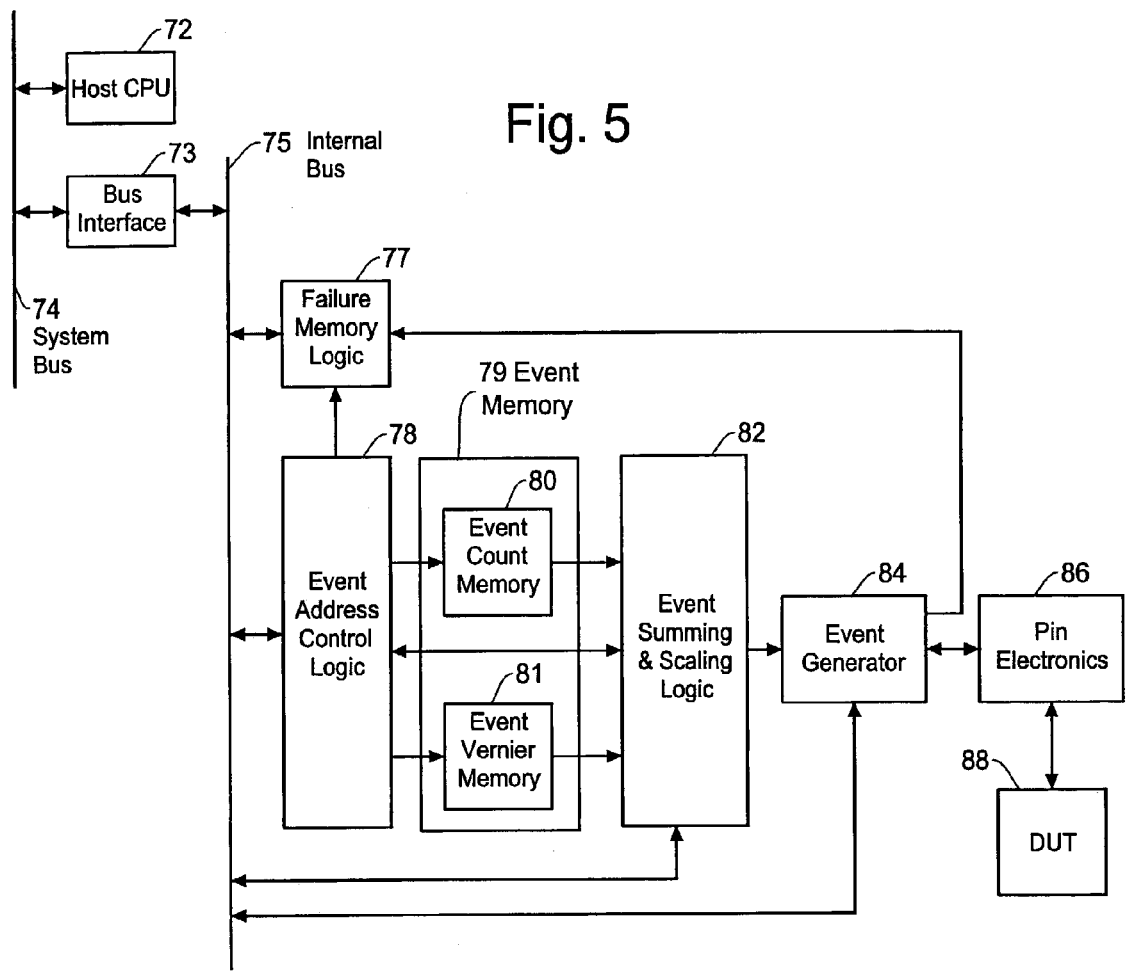
FIG. 5 is a block diagram showing an example of structure in the event based test system (event tester) for use with the production process of the present invention.

FIG. 5 is a schematic block diagram showing an example of basic structure in an event based test system (event tester) for implementing the production and test method of the present invention. The event tester includes a host computer 72 and a bus interface 73 both are connected to a system bus 74, an internal bus 75, an address control logic 78, a failure memory 77, an event memory 79, an event summing and scaling logic 82, an event generator 84, and a pin electronics 86. The event tester evaluates an IC device under test (DUT) 88 connected to the pin electronics 86.

An example of the host computer 72 is a work station having a UNIX, Window or Linux operating system. The host computer 72 functions as a user interface, such as a graphic user interface (GUI) shown in FIG. 7, to enable a user to instruct the start and stop operation of the test, to load a test program and other test conditions, to monitor and edit events, or to perform test result analysis. The host computer 72 interfaces with a test system hardware through the system bus 74 and the bus interface 73. Although not shown, the host computer 72 is preferably connected to a communication network to send or receive test information from other test systems or computer networks.

The internal bus 75 is a bus in the test system hardware and is commonly connected to most of the functional blocks. The address control logic 78 provides instructions to other functional blocks in the test system based on the test program and conditions from the host computer 72. The failure memory 77 stores test results, such as failure information of the DUT 88, in the addresses defined by the address control logic 78. The information stored in the failure memory 77 is used in the failure analysis stage of the device under test.

The address control logic 78 provides address data to an event memory 79 which typically consists of an event count memory 80 and an event vernier memory 81 as shown in FIG. 5. In an actual test system, a plurality of sets of event memory will be provided, each of which may correspond to a test pin of the test system. In the event memory 79, the event count and vernier memories 80 and 81 store the timing data for each event and the event type data. The event count memory 80 stores the timing data which is an integer multiple of the reference clock (integral part data), and the event vernier memory 81 stores timing data which is a fraction of the reference clock (fractional part data). For example, the timing data for each event is expressed by a time difference (delta time) between two adjacent events.

The event summing and scaling logic 82 is to produce data showing overall timing of each event based on the delta timing data from the event count memory 80 and event vernier memory 81. Basically, such overall timing data is produced by summing the integer multiple data and the fractional part data. During the process of summing the timing data, a carry over operation of the fractional part data (offset to the integer data) is also conducted in the timing count and offset logic 82. The timing shift function and clock scaling function for editing the events are also performed by the timing count and offset logic 82.

The event generator 84 is to actually generate the events based on the overall timing data from the event summing and scaling logic 82. The events (ex. test signals and expected values) thus generated are provided to the DUT 88 through the pin electronics 86. Basically, the pin electronics 86 is formed of a large number of components, each of which includes a driver and a comparator as well as switches to establish input and output relationships with respect to the DUT 88.

Figure 6:
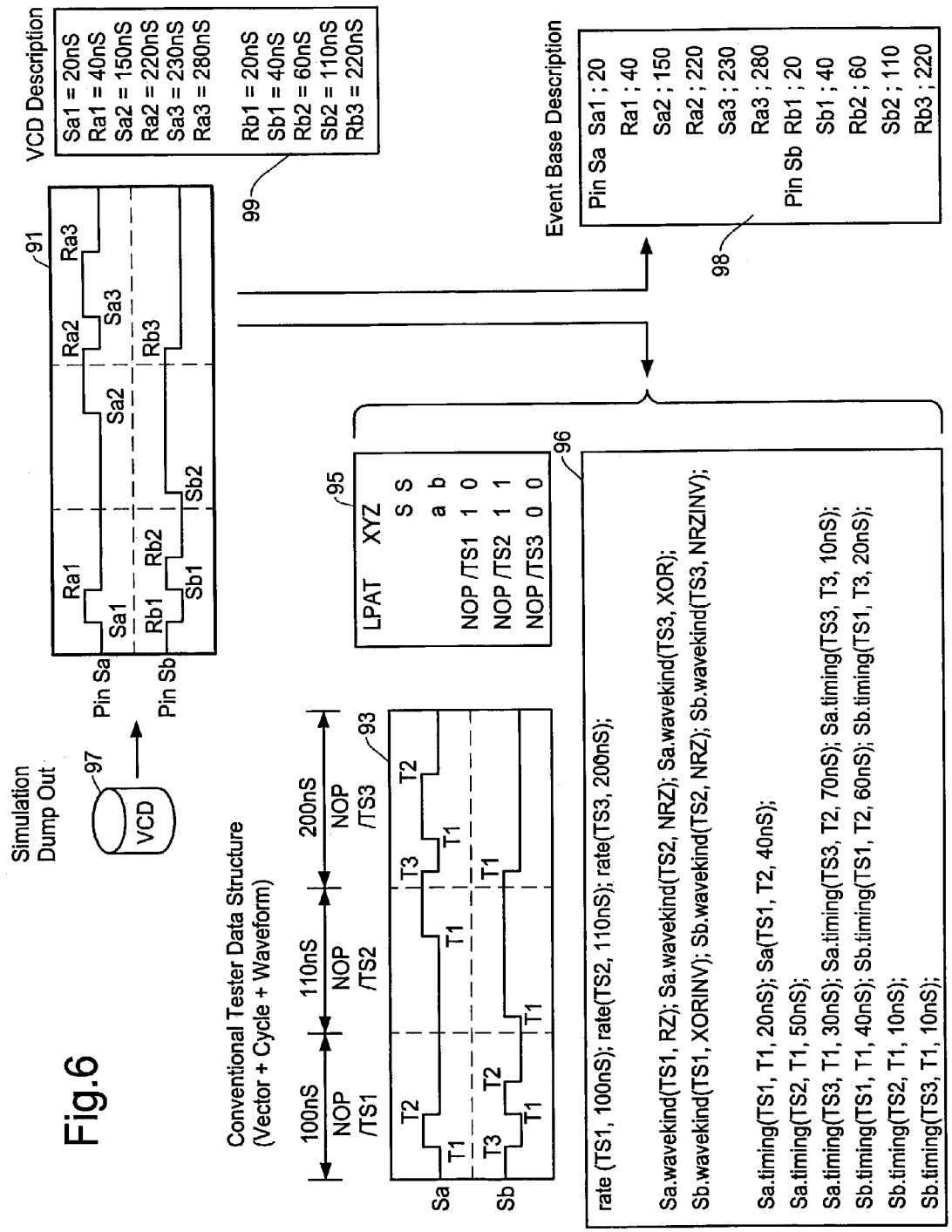
FIG. 6 is a diagram for comparing an example of data structures used in the cycle based test system (cyclized tester) and the event based test system (event tester).

FIG. 6 illustrates brief comparison between the data structure in the conventional cyclized tester and the data structure in the event tester for generating the same test signals (patterns). This example compares the case where the test pattern waveforms 91 have to be generated by the test data in the cycle based format and the test data in the event based format. The waveforms 91 are signals applied to two pins Sa and Sb of the IC device which is typically produced in the logic simulation process in the design of the IC device where VCD (Value Change Dump of Verilog) description 99 is also shown.

To produced the waveforms 91, the event data used in the event tester describes the waveforms with combinations of set and reset edges San, Sbn, Ran and Rbn, and their timings as shown in the event base description 98. In this description, the timing for each event can be expressed by a relative time length from previous event or an absolute time length from a specified reference point. As can be seen from FIG. 6, the event base description 98 is basically the same as the VCD description 99.

For producing the waveform 91 in the conventional test system based on the cycle based concept, the test data must be divided into test cycles (time-sets), waveform groups (types of waveforms and their edge timings), and vectors (pattern values). More specifically, regarding the cycle based data structure, the vector (pattern) data 95 and test cycle (time-sets) data 93 are shown in the left part of FIG. 6. Also in the drawing, a test pattern is divided into each test cycle, i.e, a combination of one or more time-sets (TS1, TS2 and TS3) and waveforms as well as the timings for each test cycle.

An example of data descriptions for such waveforms, timings and test cycles is shown in waveform data 96. An example of logic "1", "0" or "Z" of the waveforms is shown in the pattern data 95. For example, in the waveform data 96, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge (ex. start edge) of the corresponding test cycle.

As noted above, the event base description 98 is identical to the design simulation results (VCD) 99 while the cycle base description requires the time-sets and various types of waveforms and timing descriptions, which are too remote from the original design simulation result. Because of this complexity of data structure in the conventional test system, it is not possible to sufficiently convert the test data created in the design environment to the cycle based format. Further, the data conversion from the event format to the cycle format is very time consuming, complex and error-prone and endangers the accuracy of data.

Thus, in the present invention, the event tester is used in the test environment which uses time and signal value data as it is recorded in the VCD file produced in the design (EDA) environment. Thus, the data from the VCD file can be directly used in the event tester as the test vectors for an LSI device under test. To determine the pass/fail, user specifies a strobe offset for strobe low, strobe high and strobe Z to enable the device time to respond to the expected output states.

Now, referring back to FIG. 2, the overall LSI production process in the present invention is described in more detail. In an actual test, in addition to the test vectors that can be created from the VCD file, other data (test parameter, pin structure, tester pin assignment, etc.) are also necessary. Such data can also be created by utilizing the design data and simulation data existed when the first design is completed. In the present invention, the event tester simulator 27 is used to check the correctness of such data files.

The production process of FIG. 2 includes a design process under the EDA (design) environment which is typically a design center (design house), a test process by an event tester 30, and a silicon fabrication process 24 in a silicon foundry. The design environment include the event tester simulator 27 which simulates an operation of the event tester 30. The event tester simulator 27 is a software that checks the correctness of data regarding device pin-out (pin arrangement) stored in a pin file $32_1$, their mapping to tester channels stored in a socket (soc) file $32_3$, operating and I/O parametric values under which an LSI device should operate stored in a parameter (par) file $32_2$, and orders in-which tests are applied to the LSI device stored in a test plan (tpl) file $32_4$. The test vectors are events in a VCD file 36 and are verified by the event tester simulator 27. Thus, there is no need to develop a new test program.

During the design of an LSI, in this case an SOC 26 (system-on-a-chip) having cores A–C, in the EDA environment, creating of design data $28_1$–$28_2$, testbench 31 and logic simulation 29 (such as using Verilog/VHDL simulator) are repeated. At the end of the design, design data files $33_1$–$33_4$ which include RTL data, pin data, netlist data and mask data are produced which are delivered to the silicon fabrication process 24. The VCD file 36 is created as a result of the logic simulation. The event tester simulator 27 checks the correctness of the data in the test data files $32_1$–$32_4$ (pin, par, soc, tpl) and if there is an error, corrects the error. The event tester simulator 27 also checks the test vectors from the VCD file 36 through a compiler 35. Thus, the event tester simulator 27 verifies the correctness of all of the data noted above, and also verifies that loading these data files and test vectors on the tester will not cause any problem, and the event tester will run with these files and test vectors.

After verifying all of the test related data files and test vectors by the event tester simulator 27, the prototype silicon DUT 26 is created in the silicon process 24. The data from the files $32_1$–$32_4$ (that have been verified) are installed in the event tester 30 as event tester software 37. The test vectors that have been verified are installed in an event memory 38 in the event tester 30. The event tester 30 evaluates the DUT 26 by applying the test pattern from the event memory 38 through the tester hardware 39. Thus, it is possible to quickly determine whether the prototype silicon has fabrication defects or it is good as simulation vectors. In either case, the designed SOC does not face proto-hold and a deterministic transition occurs either to failure analysis or to silicon release (for application development and mass production).

The assignee of this invention has also developed a new graphic user interface (GUI) that allows the user to view signal values and timing of the test vectors and test responses. Thus, if the actual test shows a failure, the event tester can determine if this is a timing related error, and if so, the event tester can analyze details of the timing error by event edits (timing offset, scaling, etc.) through GUI 40. Based on the result of such event edition, a new testbench 34 can be created which is feedbacked to the EDA environment for further simulation.

Figure 7:
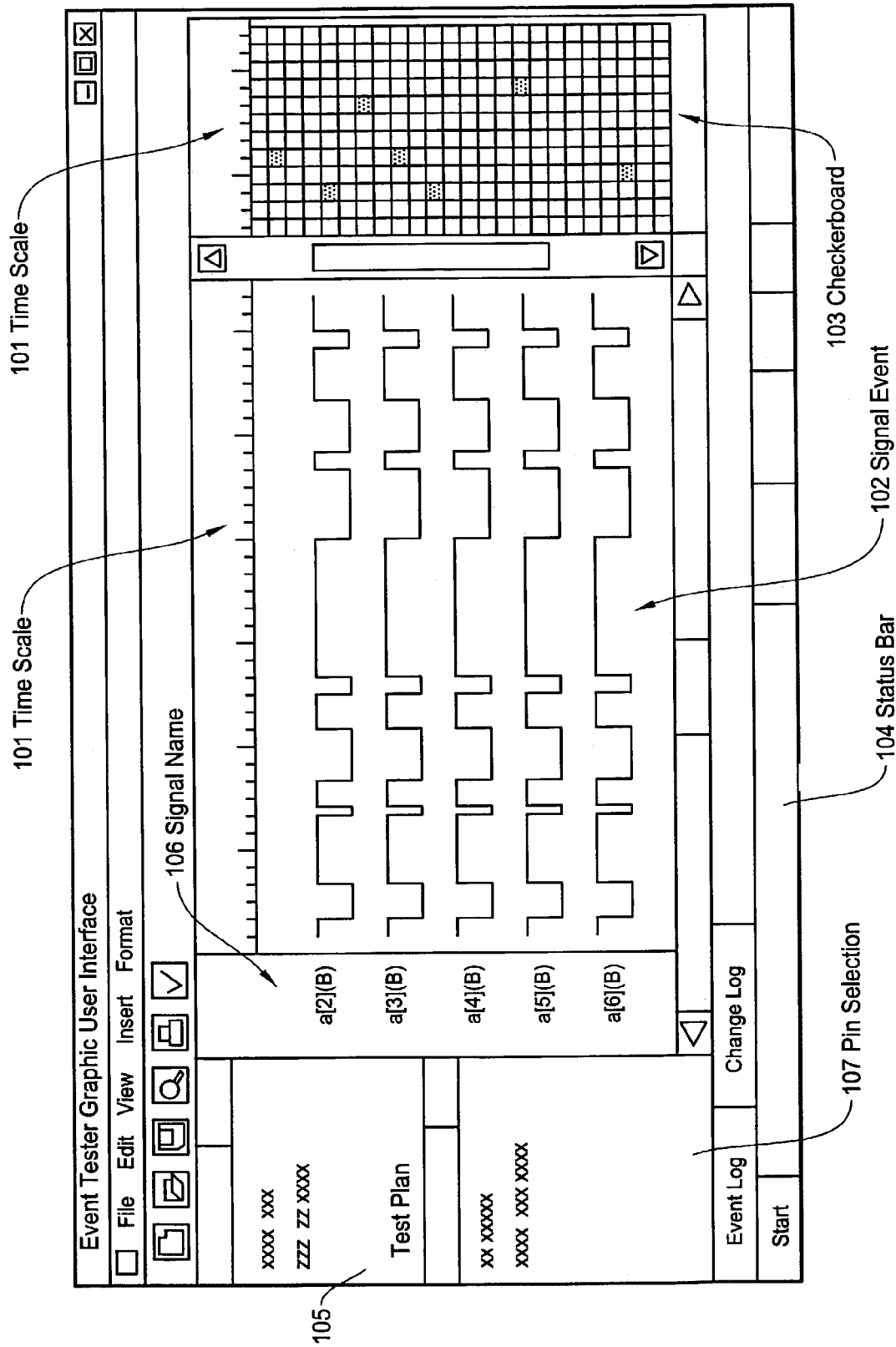
FIG. 7 is a diagram showing an example of image on a monitor screen based on a graphic user interface of the event based test system of the present invention.

FIG. 7 shows an example of display of the event tester GUI advantageously applicable to the production method of the present invention. To perform a test, user can specify various test parameters through this GUI such as power supply levels and currents, input and output voltages and currents, voltage clamps and power-supply conditions (ramp or wait times) similar to what a design engineer would do in the bench set-up. The display example of FIG. 7 includes a time scale 101, signal events 102 in combination with the time scale 101, a checkerboard 103 also with the time scale 101, signal names 106 for corresponding pins which are one-by-one relationship with the signal events 102, and windows for test plan 105, pin selection 107 and other parameters. The test response can be viewed at individual pin or a collection of pins arranged in a desired order. As all operations are event based, user can modify any event and/or its timing on the fly by simple drag operation with mouse.

The assignee has also developed a scaling function that allows to scale the timing during a selected region or on selected pins or for the whole test. For example, if a test fails, the user can simply input a scale factor to scale the whole test to run it at a different event timing. Such operation is very effective in identifying any timing related failures in the first silicon as well as speed/frequency characterization of a part. Details of the scaling is described in the U.S. application Ser. No. 09/286,226 (now U.S. Pat. No. 6,557,133) owned by the same assignee. of the present invention. Further, an example of event edit and time shift or offset is described in U.S. patent application Ser. No. 09/340,371 (now U.S. Pat. No. 6,678,643) and Ser. No. 10/039,720 (now U.S. Pat. No. 6,934,896) owned by the same assignee of the present invention. The above noted U.S. Applications are incorporated by reference.

In addition to signal event viewing, event edit and scaling functions, the assignee also developed a checkerboard map 103 such as shown in FIG. 7. The checkerboard map 103 provides a quick and condensed view of pass/fail information for the whole test; it is also an easy navigational tool. The mouse click on any section on the checkerboard synchronizes that time period to the signal event window 102. Thus, click on failure in the checkerboard 103 provides a zoomed-in view in the signal event window 102.

The assignee also developed a function with which a new testbench for simulation is created under the test environment. This testbench can be used as an input to the EDA simulator to re-simulate the design (testbench 40 in FIG. 2). After a failure is observed in the test response of prototype silicon on event tester, user can debug it by event edits and event manipulations. Once the cause of failure is understood, it is desirable to re-create simulation testbench so that the cause of failure can be fixed in design. As all operations of this tester are event based, it allows the user to capture these event and their timings, and translate them back into Verilog/VHDL testbench as shown in FIG. 2.

As described in the foregoing, since the event tester directly uses the simulation data, it can validate the silicon as soon as the prototype silicon arrives. The test-run and pass on the event tester quickly determines that (1) the prototype silicon is alive, and (2) the prototype silicon is as good as simulation vectors. Thus, the silicon can be released for application development and mass production.

If the test-run shows a failure, that means either there are timing violations (these can be debugged using the event scaling or event edits noted above) or there are fabrication defects. It is worth mentioning that the timing violations are also either due to fabrication defects or process variations. Hence, when the test-run shows a failure, the prototype silicon can be send to failure analysis to determine the defect type (bridge, open, short, gate-oxide defects etc.). In any case, it avoids proto-hold. When the test is passed, the silicon is released; when test is failed, it provides feedback of fabrication defects so that the defects in the fabrication process be fixed. It should be noted that such deterministic conclusion can only be made when there is no vector translation. In other words, such conclusion can be drawn because of the event tester and event tester simulator. Because of the vector translation, such conclusion cannot be drawn in the present day manufacturing process.

Figure 8:
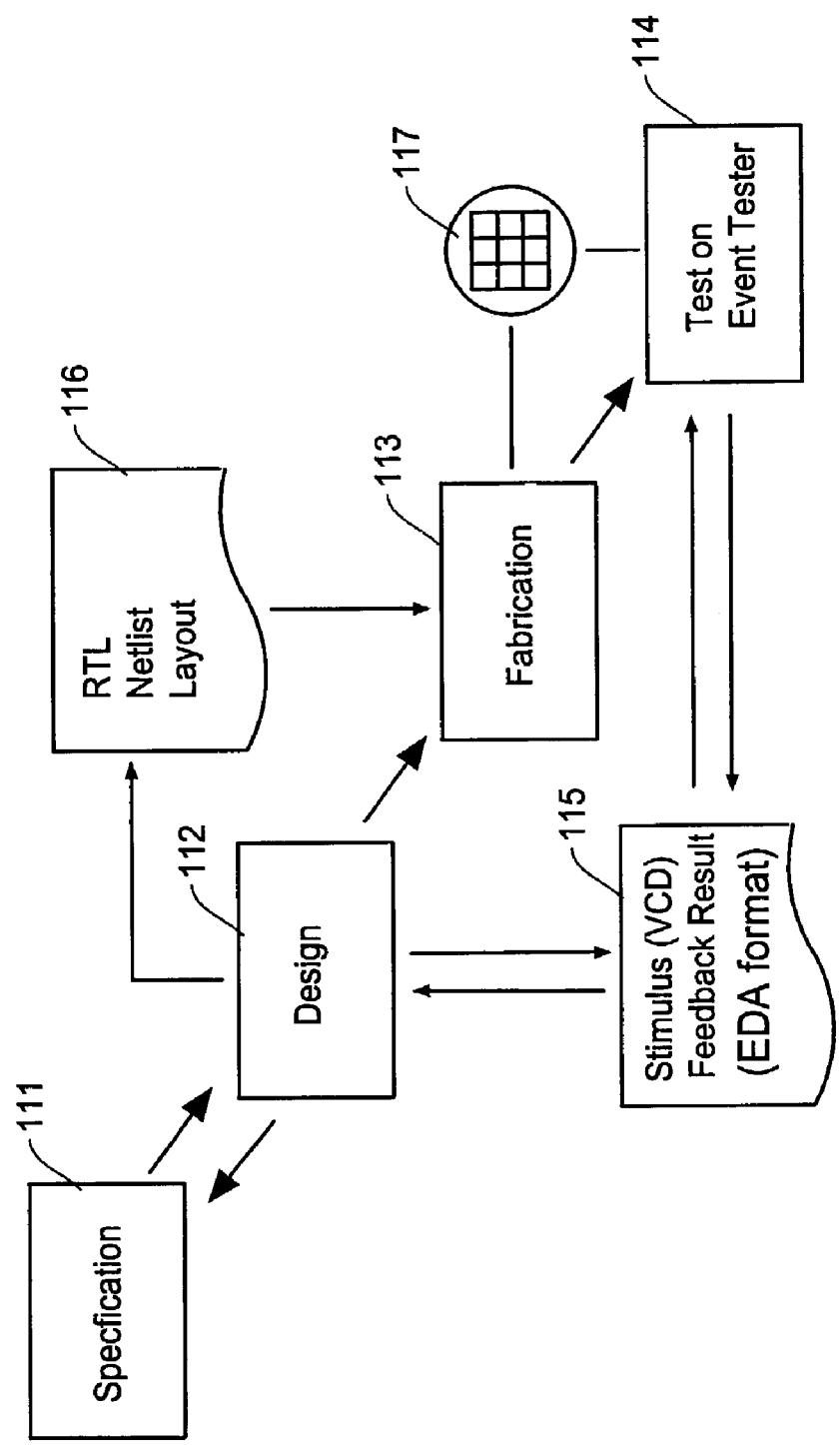
FIG. 8 is a diagram showing an example of LSI production process of the present invention using the event based test system where data formats between the design environment and the test environment are completely matched with one another.

If the event tester based testing is examined and compared it with the present-day cycle based testing, a tremendous amount of modification can be observed. The primary change comes due to the fact that the vector translation steps are eliminated altogether. To identify this difference, FIG. 8 is a diagram of the event based test flow for comparison with the cycle based test flow of FIG. 3. As illustrated with reference to FIGS. 3 and 4, due to various restrictions (timing sets, waveforms etc.), present day EDA and ATE formats are completely disjoint. Hence today, one cannot use EDA vectors "as is" on the tester and hence cannot draw a conclusion on cause of failure when test shows a failure.

In FIG. 8, with the event tester, these restrictions are eliminated and EDA vectors are used "as is". Based on the specification 111 of an intended LSI, such as ASIC or SOC, the designer designs the LSI in a design phase 112. After the design phase 112, a design data file 116 is created which is sent to a fabrication stage 113 where a prototype LSI 117 is produced. These processes are basically the same as those in FIG. 3, however, major difference resides in the test phase 114 which is done by the event tester.

As a result of the logic simulation in the design stage 112, a test stimulus (VCD) file 115 is created which is in the event format. As noted above with reference to FIG. 2, other test data files are also used that are verified by the event tester simulator in the design stage 112. The event tester uses the event format, thus is able to directly use the test stimulus file 115 which is in the event format noted above. Thus, the vector translation for format conversion such as shown in FIG. 4 is unnecessary.

Figure 9:
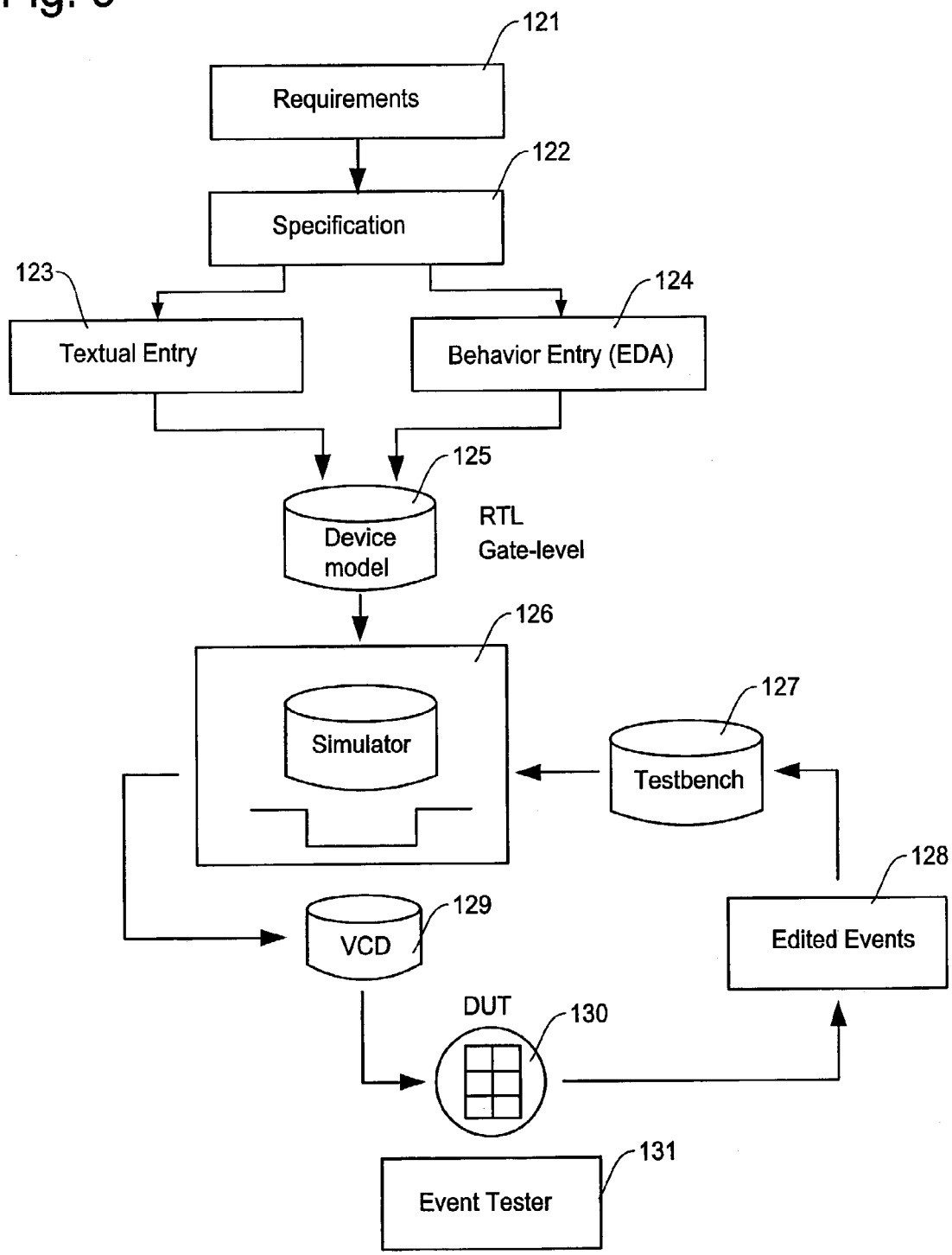
FIG. 9 is a diagram showing another example of LSI production process of the present invention using the event based test system where no data conversion is required in the process.

FIG. 9 is an analogous diagram to FIG. 4 to illustrate the differences and to provide comparison. As shown in FIG. 9, no vector translation is done and the EDA simulator vectors in the VCD format are used on the event tester. More specifically, based on the requirements 121 of the LSI, the specification 122 is created. In the EDA environment, the designer describes the intended LSI with use of Verilog/VHDL typically through textual entry 123 and behavioral entry 124. Based on such entries, a device model 125 of the intended LSI is created which is typically in an RTL level or gate level.

In the logic simulation 126, the device model 125 is repeatedly evaluated with use of a testbench. As a result of the logic simulation 126, an event vector file is created which is typically a VCD (value change dump) file 129 of Verilog. The VCD file 29 includes data showing value changes and time for inputs and outputs of the LSI. A prototype LSI 130 is tested by the event tester 131 which uses the vectors in the VCD file 129. With use of the GUI, scaling, event offset and edit functions noted above, in step 128, the event tester 131 modifies the test vectors if there is a failure and creates a new testbench 127 which is feed-backed to the EDA environment for further simulation.

In the process of FIG. 9, it should be noticed that the event tester based testing also provides a complete loop (design-test-design), which cannot be done in the present day existing technology. In FIG. 9, this complete loop is possible because of the new testbench creation as mentioned above and because every task (design as well as testing) is done in one environment.

Figure 10:
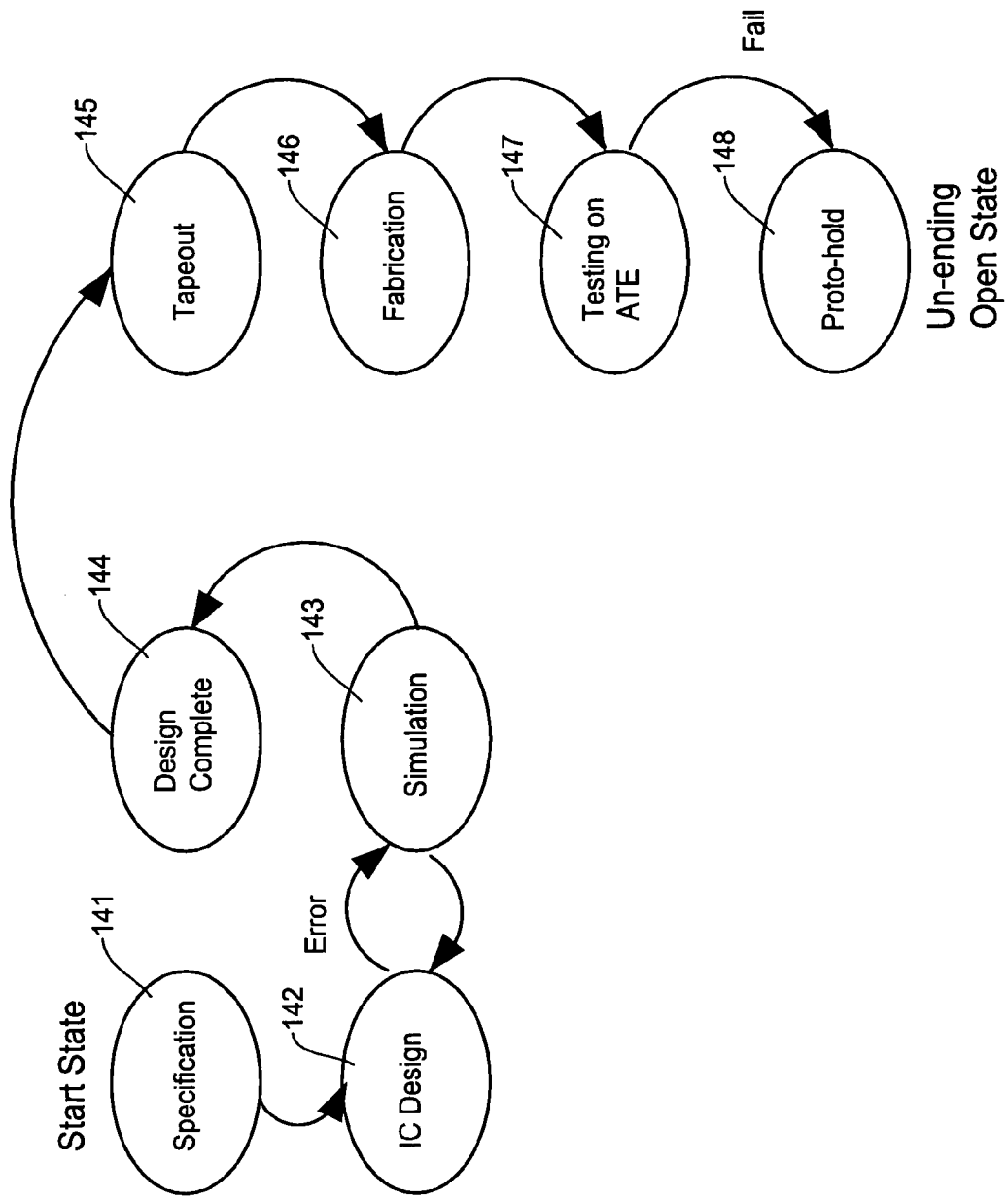
FIG. 10 is a state diagram showing an example of semiconductor manufacturing process in the conventional technology involving the proto-hold.

The state diagram of today's manufacturing process is shown in FIG. 10. The process starts at the specification state 141, and proceeds to the IC design state 142, simulation state 143, and design completion state 144. In the tapeout state 145, the design data is delivered to the fabrication state 146. The prototype LSI is tested in the ATE testing state 147. In the industrial process for semiconductor manufacturing today, when a failure occurs in the testing state 147, the LSI faces the proto-hold 148 because there are multiple causes of failure such as error in vector translation, error in test program, fabrication defect, etc.

As shown in FIG. 10, it is an open-ended process; the proto-hold being an open state. Because of this open state, the whole process is undeterministic. During the proto-hold 148, engineers struggle to identify the cause of failure arid depend upon various trial-and-error operations. Until the cause of failure is identified, the silicon cannot be released or cannot be sent to failure analysis to identify the defect type because the cause of failure may not be defect, it may be a vector translation error or error in the test program.

Figure 11:
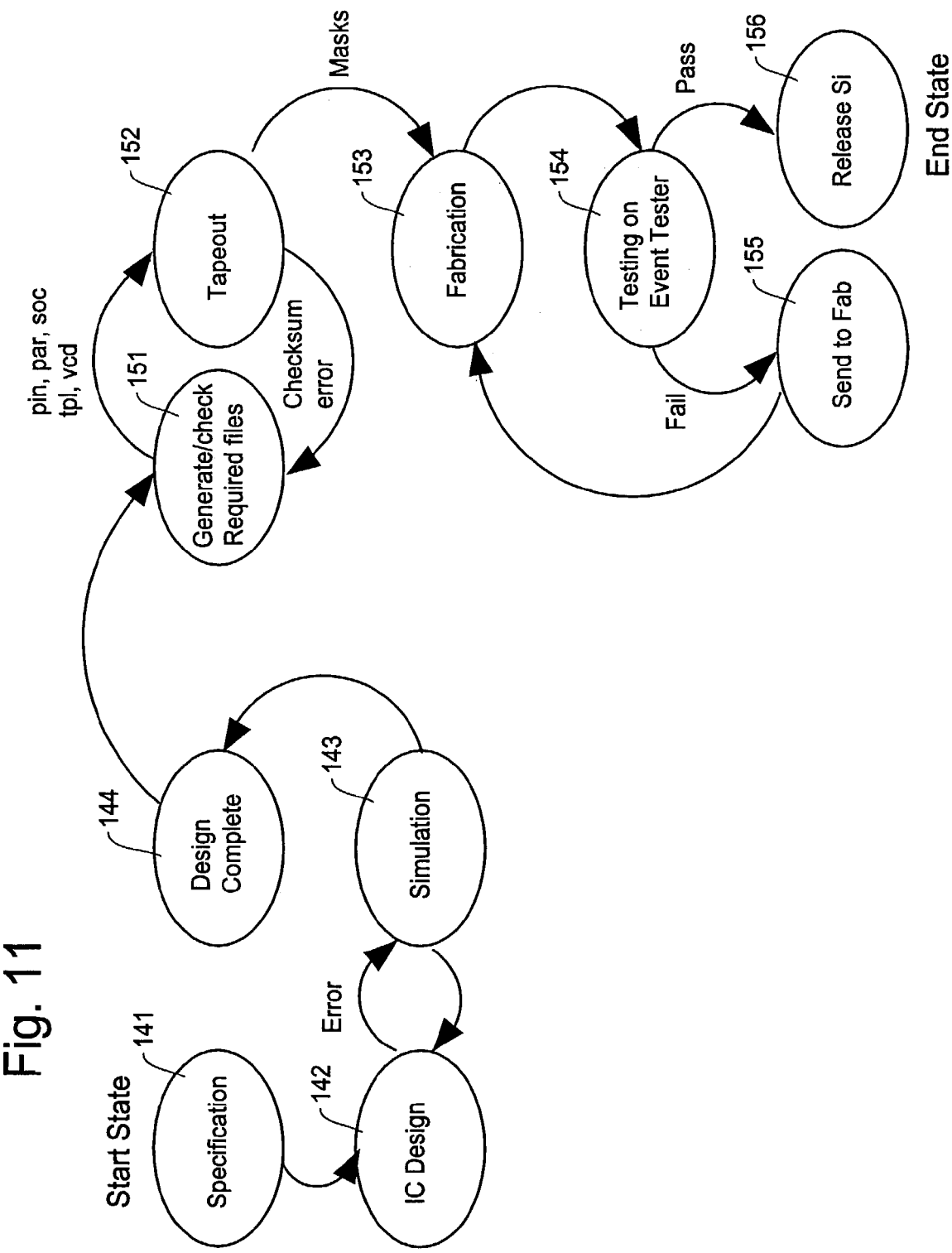
FIG. 11 is a state diagram showing an example of semiconductor manufacturing process in the present invention that avoids the proto-hold.

In the production process of the present invention, the above uncertainty is eliminated by using the event tester and not doing any vector translation or developing a test program. The state diagram of the new process is shown in FIG. 11. In the state 151, the process generates and checks the required files. As described in the foregoing, the event tester simulator verifies such files (pin, par, soc, tpl, vcd) in the state 151 with use of the data produced in the design state 142 and simulation state 143.

Thus, at the tapeout 152, the design data (RTL, netlist, mask) is sent to the fabrication state 153 and the files (pin, par, soc, tpl, vcd) with various simulation data are sent to the testing state 154 for testing the prototype LSI by the event tester. If a failure is detected, the cause of the failure will be feedbacked to the fabrication in the stage 155. If the test result shows no problems, the prototype silicon is released in the state 156 for the application development and mass production.

As illustrated in FIG. 11, it is a close-ended process with no proto-hold and trial-and-error. In this process, the silicon is released in a deterministic manner. To achieve this deterministic end-state, fundamental changes are required throughout. For example, as shown in FIG. 11, the tapeout 152 includes the pin, par, soc, tpl and vcd files as oppose to only a GDSII (graphical design standard II) layout database. Another fundamental requirement is to integrate the event tester in the production process; no vector translation and no test program generation.

Figure 12:
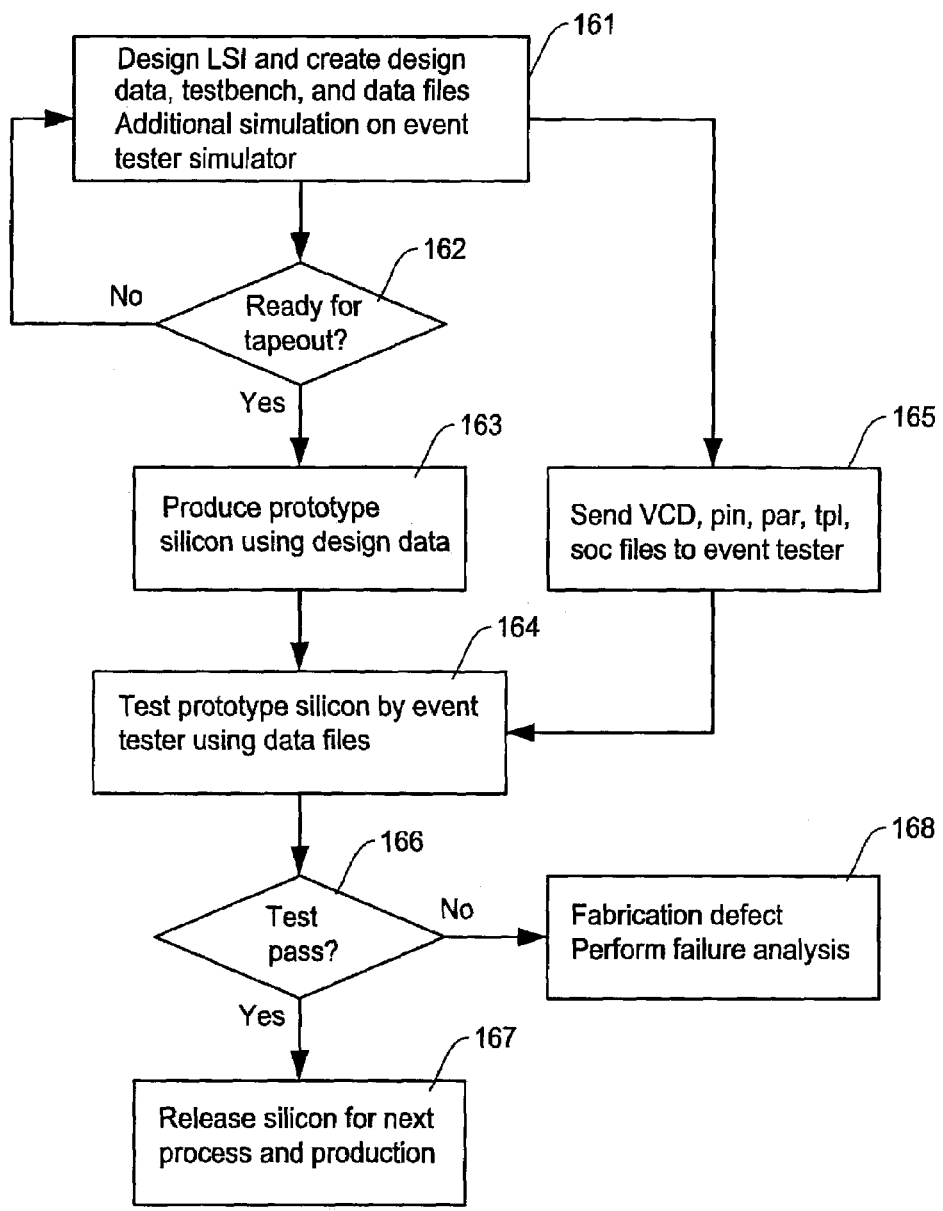
FIG. 12 is a flow chart showing an example of semiconductor manufacturing process in the present invention where an event tester is incorporated in the test-engineering environment and an event tester simulator is incorporated in the design environment.

FIG. 12 is a flow chart showing the overall flow for industrial process in the present invention. In FIG. 12, LSI design is conducted at step 161 which is typically done in a design house (design center). As described in the foregoing, in addition to the ordinary EDA tools, the event tester simulator is also incorporated in this process. In step 162, it is determined whether the tapeout is ready. In this process, not only the data for the fabrication, but also the various files (pin, par, soc, tpl, vcd) for the event tester are checked.

In step 163, the prototype silicon is produced by a fabrication provider (silicon foundry) based on the design data. Although the design house and the silicon foundry are identified separately; they can be two separate groups or divisions within a company or two different companies. The prototype silicon is tested by the event tester in step 164 which uses the files (vcd, pin, par, etc.) provided through a step 165. As noted above, such files are created in the EDA environment using the event tester simulator and the Verilog/VHDL simulator.

In the present implementation, the assignee has used ASCII text files for these files (pin, par, tpl, etc.), although any other format is also possible. Further, instead of using separate files, one can combine them or re-structure them differently, such as in either one or two files. Similarly, some variations in the process and flow are possible; for example, instead of the design house or design center in the step 161, a third party can generate the pin, par, soc and tpl files.

In the step 166, if the test shows a failure, the cause of the failure is detected. Since the test vectors have been examined in the design stage and the same test vectors are used in the event tester, if a failure is detected in step 166, the failure is considered a fabrication failure. Thus, in step 168, the failure analysis is conducted to find out the problems in the fabrication process. If the test result shows a pass result, the prototype silicon is released in step 167 for the application development and mass production.

In this flow of FIG. 12, the design engineer sends the files (pin, par, tpl, soc) and simulation vectors (VCD from simulator) along with layout database (GDSII) to the fabrication. It should be noted that in the existing technology and practices, design engineer sends only the layout database and pinout (pin) to the silicon foundry (par, soc, tpl file do not exist in the existing technology). When the fabrication completes manufacturing, in other words, when the prototype silicon arrives, an engineer in the fabrication can put that silicon on event tester and run the simulation vectors and quickly determine whether silicon has fabrication defects or it is good as simulation vectors. In either case, silicon does not face proto-hold and a deterministic transition occurs either to failure analysis or to silicon release.

In the foregoing, a new industrial process for IC manufacturing is described which is deterministic and avoids proto-hold. This solution includes the new equipment (new tester and tester simulator) and flow based upon this tester and tester simulator. This tester operates in the event environment, the environment in which the device was designed and simulated. In essence, this event tester extends the design environment for testing. Besides solving the proto-hold issue, another advantage of this tester and method is that the entire test process simplifies drastically and it provides a direct link from design simulation to testing. For first silicon debug and characterization, this is a major benefit because designers can check device response under multiple versions of simulation test vectors.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. An LSI manufacturing method to avoid prototype-hold, comprising the following steps of:

designing an LSI under an EDA (electronic design automation) environment to produce design data of a designed LSI;

performing logic simulation on a device model of the LSI design in the EDA environment with use of a testbench and producing a test vector file of event based test vectors as a result of the logic simulation;

producing test related data files with use of the design data and event based test vectors;

producing an event tester simulator which simulates an operation of an event tester where the event tester simulator is software which runs on a computer system and the event tester is a physical system having tester hardware for testing physical LSIs;

verifying the test related data files and the event based test vectors through the event tester simulator where the test related data in the test related data files include data concerning signal parameters and sockets that are unique to the event tester;

producing a prototype LSI through a fabrication provider by using the design data;

testing the prototype LSI by the event tester by using the event based test vectors and test related data files verified by the event tester simulator and debugging errors by event edits and feedbacking test results to design engineers and the fabrication provider; and wherein simulation test vectors in said test vector file are directly used in the event tester without data conversion or translation to be applied to the prototype LSI.

2. The LSI manufacturing method as defined in claim 1, wherein simulation test vectors in said test vector file are directly used in the event tester without vector conversion or translation to be applied to the prototype LSI, and data in said test related data files are directly used in the event tester for specifying test conditions including parameters of the test pattern for testing the prototype LSI.

3. The LSI manufacturing method as defined in claim 1, wherein said step of performing the logic simulation includes a step of creating a VCD (Value Change Dump of Verilog) file as the test vector file.

4. The LSI manufacturing method as defined in claim 1, wherein said step of verifying the test related data files by said event tester simulator includes a step of checking correctness of LSI pin arrangement in a pin file, their mapping to tester channels in a socket file, I/O parametric values for the prototype LSI in a parameter file, and orders of tests in a test plan file.

5. The LSI manufacturing method as defined in claim 1, wherein said event tester simulator verifies that the event based test vectors produced through the logic simulation will be loaded successfully on the event tester.

6. The LSI manufacturing method as defined in claim 1, wherein said event tester simulator checks the test related data files and the event based test vectors produced through the logic simulation so that any error therein are corrected before being used on the event tester.

7. The LSI manufacturing method as defined in claim 1, wherein said event tester operates with the event based test vectors and data in the test related data files, all of which are verified by the event tester simulator, thereby performing the test on the LSI without separately creating a test program.

8. The LSI manufacturing method as defined in claim 1, wherein said step of testing the prototype LSI by the event tester includes a step of storing said event based test vectors in said test vector file derived directly from the logic simulation on the LSI design in the EDA environment in an event memory of the event tester, and generating and applying the event based test vectors from the event memory to the prototype LSI, and evaluating response outputs of the prototype LSI at predetermined timings.

9. The LSI manufacturing method as defined in claim 1, wherein said step of testing the prototype LSI by the event tester includes a step of creating a new testbench based on the test result and sending the new testbench to the design environment for further logic simulation.

10. An LSI manufacturing apparatus to avoid prototype-hold, comprising:
    means for designing an LSI under an EDA (electronic design automation) environment to produce design data of a designed LSI;
    means for performing logic simulation on a device model of the LSI design in the EDA environment with use of a testbench and producing a test vector file of event based test vectors as a result of the logic simulation;
    means for producing test related data files with use of the design data and event based test vectors;
    an event tester simulator for verifying the test related data files and the event based test vectors, where the event tester simulator is software which runs on a computer system and the event tester is a physical system having tester hardware for testing physical LSIs, and the test related data in the test related data files include data concerning signal parameters and sockets that are unique to the event tester;
    means for producing a prototype LSI through a fabrication provider by using the design data;
    an event tester for testing the prototype LSI by using the event based test vectors and test related data files verified by the event tester simulator and debugging errors by event edits and feedbacking test results to design engineers and the fabrication provider; and
    wherein simulation test vectors in said test vector file are directly used in the event tester without data conversion or translation to be applied to the prototype LSI.

11. The LSI manufacturing apparatus as defined in claim 10, wherein simulation test vectors in said test vector file are directly used in the event tester without vector conversion or translation to be applied to the prototype LSI, and data in said test related data files are directly used in the event tester for specifying test conditions including parameters of the test pattern for testing the prototype LSI.

12. The LSI manufacturing apparatus as defined in claim 10, wherein said means for performing the logic simulation includes means for creating a VCD (Value Change Dump of Verilog) file as the test vector file.

13. The LSI manufacturing apparatus as defined in claim 10, wherein said event tester simulator for verifying the test related data files includes means for checking correctness of LSI pin arrangement in a pin file, their mapping to tester channels in a socket file, I/O parametric values for the prototype LSI in a parameter file, and orders of tests in a test plan file.

14. The LSI manufacturing apparatus as defined in claim 10, wherein said event tester simulator verifies that the event based test vectors produced through the logic simulation will be loaded successfully on the event tester.

15. The LSI manufacturing apparatus as defined in claim 10, wherein said event tester simulator checks the test related data files and the event based test vectors produced through the logic simulation so that any error therein are corrected before being used on the event tester.

16. The LSI manufacturing apparatus as defined in claim 10, wherein said event tester operates with the event based test vectors and data in the test related data files, all of which are verified by the event tester simulator, thereby performing the test on the LSI without separately creating a test program.

17. The LSI manufacturing apparatus as defined in claim 10, wherein said event tester for testing the prototype LSI by the event tester includes means for storing the event based test vectors in said test vector file derived directly from the logic simulation on the LSI design in an event memory of the event tester, and generating said event based test vectors and applying said test vectors to the prototype LSI, and evaluating response outputs of the prototype LSI at predetermined timings.

18. The LSI manufacturing apparatus as defined in claim 10, wherein said event tester for testing the prototype LSI by the event tester includes means for creating a new testbench based on the test result and sending the new testbench to the design environment for further logic simulation.

* * * * *